(12) United States Patent
Mathew et al.

(10) Patent No.: US 7,323,373 B2
(45) Date of Patent: Jan. 29, 2008

(54) METHOD OF FORMING A SEMICONDUCTOR DEVICE WITH DECREASED UNDERCUTTING OF SEMICONDUCTOR MATERIAL

(75) Inventors: Leo Mathew, Austin, TX (US); David C. Sing, Austin, TX (US); Venkat Kolagunta, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 26 days.

(21) Appl. No.: 11/339,133

(22) Filed: Jan. 25, 2006

(65) Prior Publication Data
US 2007/0172996 A1    Jul. 26, 2007

(51) Int. Cl.
*H01L 21/00* (2006.01)

(52) U.S. Cl. ............................. 438/156; 257/E21.41

(58) Field of Classification Search ............ 438/156, 438/158, 157, 173, 192, 206, 207
See application file for complete search history.

(56) References Cited

U.S. PATENT DOCUMENTS

| | | | |
|---|---|---|---|
| 5,952,706 A * | 9/1999 | Bashir | ............... 257/587 |
| 6,177,706 B1 | 1/2001 | Shindo et al. | |
| 6,252,284 B1 | 6/2001 | Muller et al. | |
| 6,413,802 B1 | 7/2002 | Hu et al. | |
| 6,630,712 B2 | 10/2003 | Yu | |
| 6,746,924 B1 | 6/2004 | Lee et al. | |
| 6,750,122 B1 * | 6/2004 | Schafbauer | ............... 438/491 |
| 6,806,584 B2 | 10/2004 | Fung et al. | |
| 6,864,519 B2 | 3/2005 | Yeo et al. | |
| 2004/0150071 A1 | 8/2004 | Kondo et al. | |
| 2004/0222477 A1 | 11/2004 | Aller et al. | |
| 2004/0235300 A1 | 11/2004 | Mathew et al. | |
| 2005/0250279 A1 * | 11/2005 | Son et al. | ............... 438/216 |
| 2006/0292781 A1 * | 12/2006 | Lee | ............... 438/197 |
| 2007/0085134 A1 | 4/2007 | Anderson et al. | |

OTHER PUBLICATIONS

Hisamoto, Digh et al.; "A Fully Depleted Lean-Channel Transistor (DELTA)—A Novel Vertical Ultrathin SOI MOSFET"; IEEE Electron Device Letters; Jan. 1990; pp. 36-38; vol. 11, No. 1; IEEE.
Mathew, L. et al.; "*Inverted T chanlle FET*(ITFET)—Fabrication and Characteristics of Vertical-Horizontal, Thin Body, Multi-Gate, Multi-Orientation Devices, ITFET SRAM Bit-cell operation. A Novel Technology for 45nm and Beyond CMOS"; IEEE International Electron Devices Meeting, Washington DC; Dec. 2005.
U.S. Appl. No. 10/909,095 filed Jun. 30, 2004.

* cited by examiner

*Primary Examiner*—Michael Lebentritt
*Assistant Examiner*—Reema Patel
(74) *Attorney, Agent, or Firm*—Robert L. King; Kim-Marie Vo (57) ABSTRACT

A semiconductor device is formed by patterning a semiconductor layer to create a vertical active region and a horizontal active region, wherein the horizontal active region is adjacent the vertical active region. The semiconductor layer overlies an insulating layer. A spacer is formed adjacent the vertical active region and over a portion of the horizontal active region. At least a portion of the horizontal active region is oxidized to form an isolation region. The spacer is removed. A gate dielectric is formed over the vertical active region after removing the spacer. A gate electrode is formed over the gate dielectric. However, forming the spacer is optional.

3 Claims, 8 Drawing Sheets

METHOD OF FORMING A SEMICONDUCTOR DEVICE WITH DECREASED UNDERCUTTING OF SEMICONDUCTOR MATERIAL

CROSS REFERENCE TO RELATED APPLICATIONS

This application is related to the following pending applications:

(1) U.S. Ser. No. 11/257,973 entitled "A Method of Making An Inverted-T Channel Transistor" by Mathew et al., filed Oct. 25, 2005 and assigned to the assignee of record herein;

(2) U.S. Ser. No. 11/047,543, entitled "Hybrid-FET And Its Application as SRAM" by Mathew et al., filed Jan. 31, 2005 and assigned to the assignee of record herein;

(3) U.S. Ser. No. 11/257,972, entitled "Multiple Device Types Including An Inverted-T Channel Transistor and Method Therefore" by Mathew et al., filed Oct. 25, 2005 and assigned to the assignee of record herein; and (4) U.S. Ser. No. 11/092,289, entitled "Method of Forming A Semiconductor Device Having Asymmetric Dielectric Regions and Structure Thereof" by Mathew et al., filed Mar. 29, 2005 and assigned to the assignee of record herein.

FIELD OF THE INVENTION

This invention relates generally to semiconductor devices, and more specifically, to methods of manufacture of semiconductor devices.

BACKGROUND OF THE INVENTION

The use of FinFETs is very attractive for manufacturing for increasing the density and electrical characteristics of MOS transistors. The fin rises above a substrate to function as the channel so that a major portion of the transistor is vertical and not lateral. The channel direction is lateral or horizontal but is in a structure that is above the surface of the substrate. One of the difficulties however, has been the manufacture of these vertical structures over silicon on insulator (SOI) during the process of thinning the silicon fin by oxidation and cleans. Oxidizing and consuming a portion of the fin is desired in order to form sub-lithographic fin dimensions by cleaning the oxide.

However, the oxide region under the fin gets etched and creates a void. This void leads to undesirable manufacturing problems such as the fins physically falling over or collapsing and allowing for future process layers such as the gate electrode to be difficult to remove from the voids.

Where FinFETs are formed on a bulk silicon substrate, the oxidization of wide structural elements, such as the source and drain, will result in unoxidized portions of silicon underlying elements such as a source or drain that are connected to other unoxidized portions of silicon through the silicon bulk. This requires extensive isolation techniques to electrically isolate adjacent transistors. The failure to oxidize the portions of silicon in a bulk silicon substrate underlying these elements is from the fact that an oxidation which would be sufficient to prevent the problem would result in oxidizing the channel region of the fin. The oxidization of the channel region makes the channel region electrically inactive and results in failure of the FinFET.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
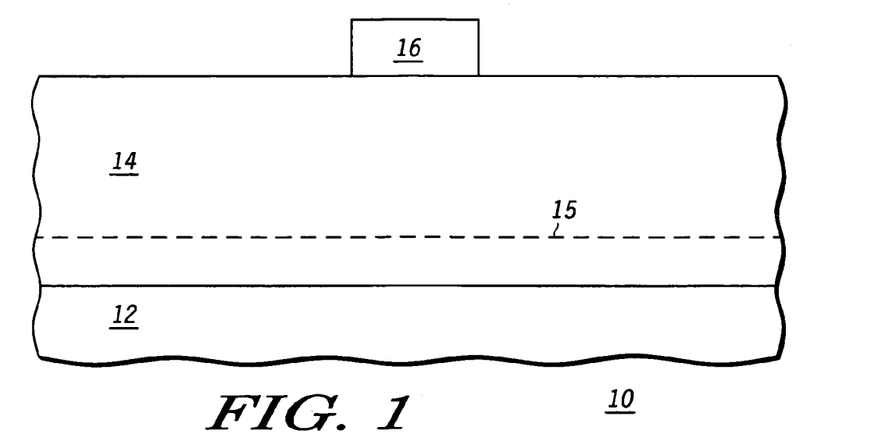
FIGS. 1-7 illustrate in cross-sectional form a method for forming a semiconductor device in accordance with one form of the present invention.

Illustrated in FIG. 1 is a semiconductor device 10 in accordance with one form of the present invention. A buried oxide (Box) layer 12 is provided as a substrate or base layer. Overlying the buried oxide layer 12 is a silicon layer 14. The silicon layer 14 is single crystalline. Overlying the silicon layer 14 is a hard mask 16 having a predetermined width for masking a predetermined portion of the underlying silicon layer 14. The hard mask 16 is formed of any of several well known conventional materials such as being formed of nitride. Within the silicon layer 14 is an etch trace layer 15 which is placed at a predetermined depth of silicon layer 14 during the formation of silicon layer 14.

Figure 2:
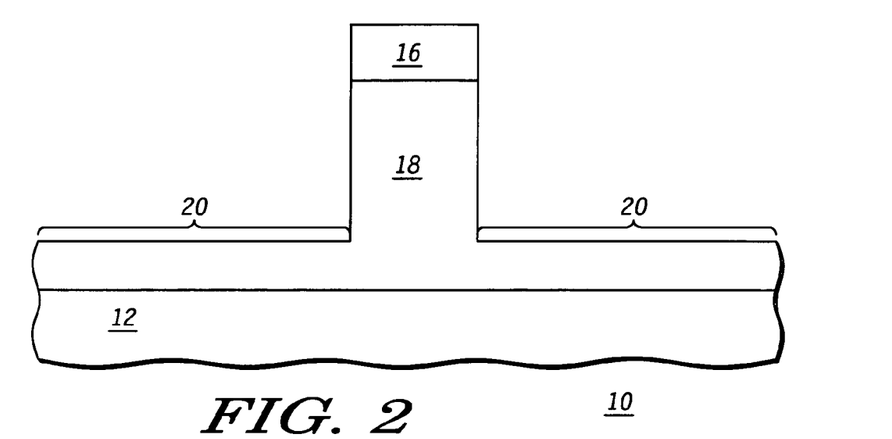

Illustrated in FIG. 2 is further processing of semiconductor device 10 wherein the semiconductor device 10 is exposed to a conventional dry etch. The dry etch removes a significant portion of the silicon layer 14 in those areas which are not covered by the hard mask 16. The chemistry of the dry etch does not attack or remove any of silicon layer 14 along exposed sides underlying the hard mask 16. The etch trace layer 15 is used as a reference point to permit accurate etching of the silicon layer 14. The etch trace layer 15 functions as a detection mechanism which determines when the etch is stopped or how much longer the etch is allowed after detection of etch trace layer 15 occurs. The dry etch results in formation of a vertical active region 18 formed from silicon layer 14 and the formation of a horizontal active region 20 around the perimeter of the vertical active region 18 in all directions. As a result of the dry etch, a fin structure is formed from the silicon layer 14. It should be noted that the vertical active region 18 also extends perpendicular to the view illustrated in FIG. 2 to be used later as a source region 34 and a drain region 36.

Figure 3:
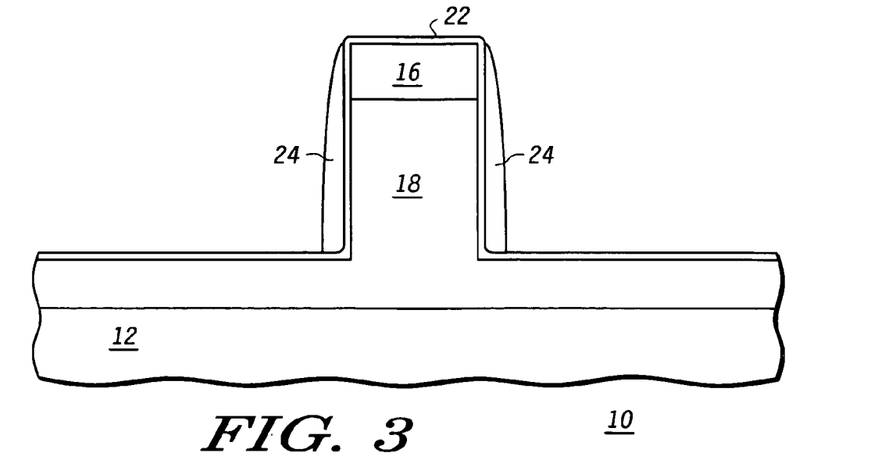

Illustrated in FIG. 3 is further processing of semiconductor device 10 wherein an etch stop liner 22 has been formed overlying the exposed surfaces of semiconductor device 10. As a result, the etch stop liner 22 is formed on both exposed horizontal and vertical surfaces. Additionally, sidewall spacers 24 are formed along the sides of the fin structure formed by the vertical active region 18 and the hard mask 16. At this point in the processing a fin structure of silicon overlying silicon which extends laterally from the fin structure has been formed. Additionally, the silicon overlies the buried oxide (Box) layer 12.

Figure 4:
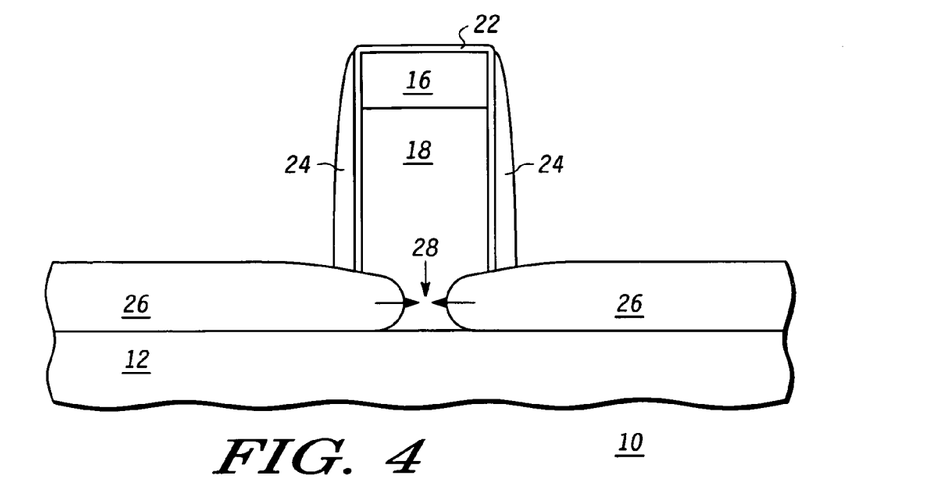

Illustrated in FIG. 4 is further processing of semiconductor device 10 wherein the semiconductor device 10 is oxidized in an oxygen ambient. The oxidation step oxidizes all exposed silicon and results in a thermally grown isolation region 26. The thermally grown isolation region is adjacent the perimeter of the fin structure. Thermally grown oxides have a slower etch rate than buried oxides which are deposited oxides. Additionally, the oxidation functions to consume the silicon underlying the edges of the fin structure and encroaches the area underlying the fin structure. In one form an unoxidized silicon area 28 remains.

Figure 5:
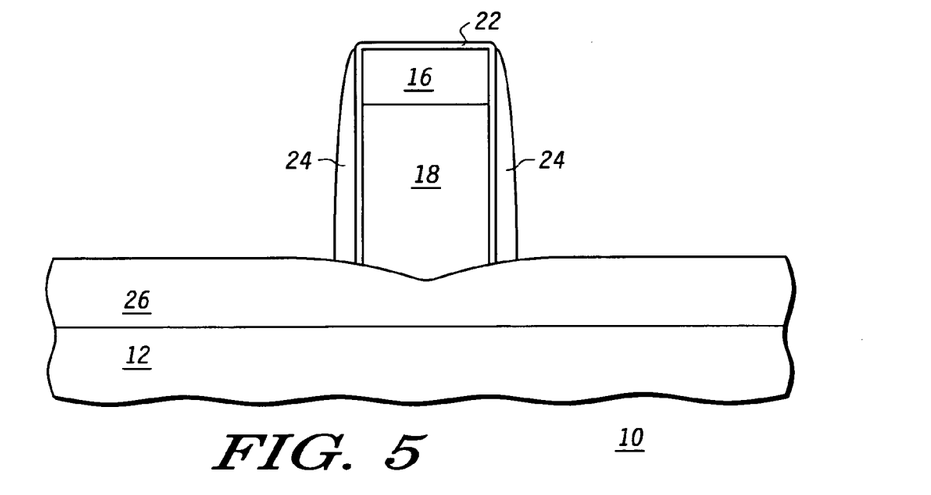

Illustrated in FIG. 5 is alternate processing of semiconductor device 10 from FIG. 3 rather than the FIG. 4 embodiment. In the FIG. 5 form the oxidation of silicon layer 14 continues at a rate sufficient to make the isolation region 26 continuous laterally. As the unoxidized silicon area 28 closes and isolation region 26 becomes laterally continuous, a small nonplanarity exists underlying the vertical active region 18. However, the isolation region 26 grows sufficiently thick to electrically insulate the vertical active region 18 from the buried oxide layer 12. Additionally, at points lateral to the perimeter of the active vertical region 18, the isolation region 26 grows to a height that is greater than a lowest portion of the active vertical region 18. This height of the isolation region 26 is important later as it can be used to avoid any undercutting at the edge of the vertical active region 18 during cleans and etches when some of the isolation region 26 is removed.

Figure 6:
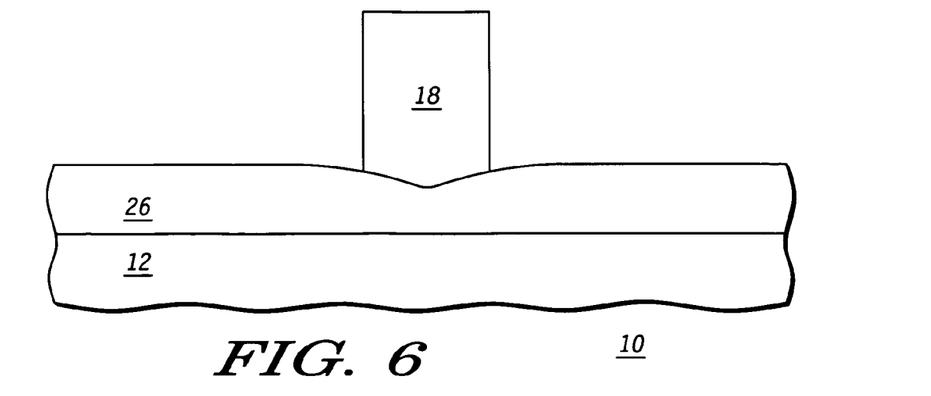

Illustrated in FIG. 6 is further processing of semiconductor device 10. A wet etch is performed to remove sidewall spacer 24, the etch stop liner 22 and the hard mask 16. As a result, the vertical active region 18 remains and is electrically isolated from the buried oxide layer 12 by the isolation region 26. As a result of the wet etch, the depth of the isolation region 26 may decrease somewhat. The wet etch is a conventional etch such as hydrofluoric acid, HF, to remove oxide material and phosphoric acid to remove the hard mask 16 assuming that hard mask 16 is nitride.

Figure 7:
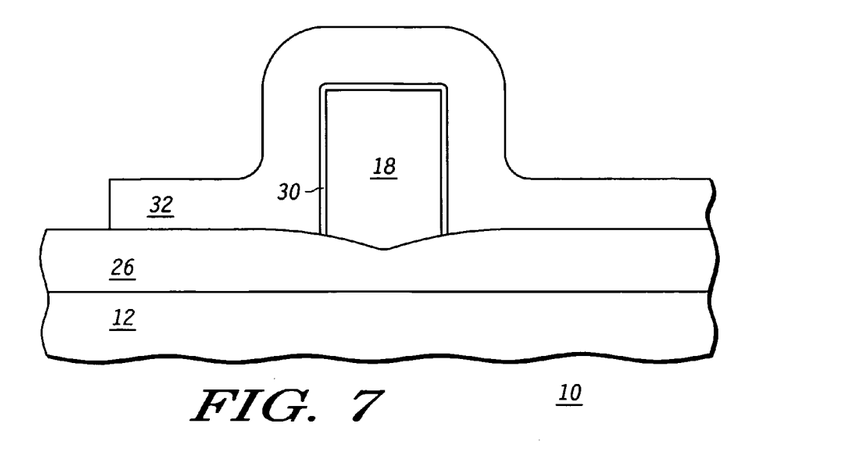

Illustrated in FIG. 7 is further processing of semiconductor device 10 wherein a gate is formed for a FinFET. In particular, a gate dielectric 30 is formed around exposed edges of the vertical active region 18. In the illustrated form the gate dielectric 30 is grown from the exposed surfaces of the vertical active region 18. If the gate dielectric 30 is deposited, the gate dielectric 30 would also overlie the isolation region 26. Overlying a portion of the isolation region 26 and the gate dielectric 30 is a gate electrode 32. The gate electrode 32 may be formed by deposition of conductive material such as polysilicon, metal or a combination of both materials. In one form the gate electrode 32 is formed of multiple layers of polysilicon and metal such as titanium nitride, TiN. It should be noted that the formation of the gate electrode 32 is selective by using a mask (not shown). For example, on the illustrated left of the fin structure of FIG. 7 the gate electrode 32 terminates whereas on the right of the fin structure of FIG. 7 the gate electrode 32 continues.

Figure 8:
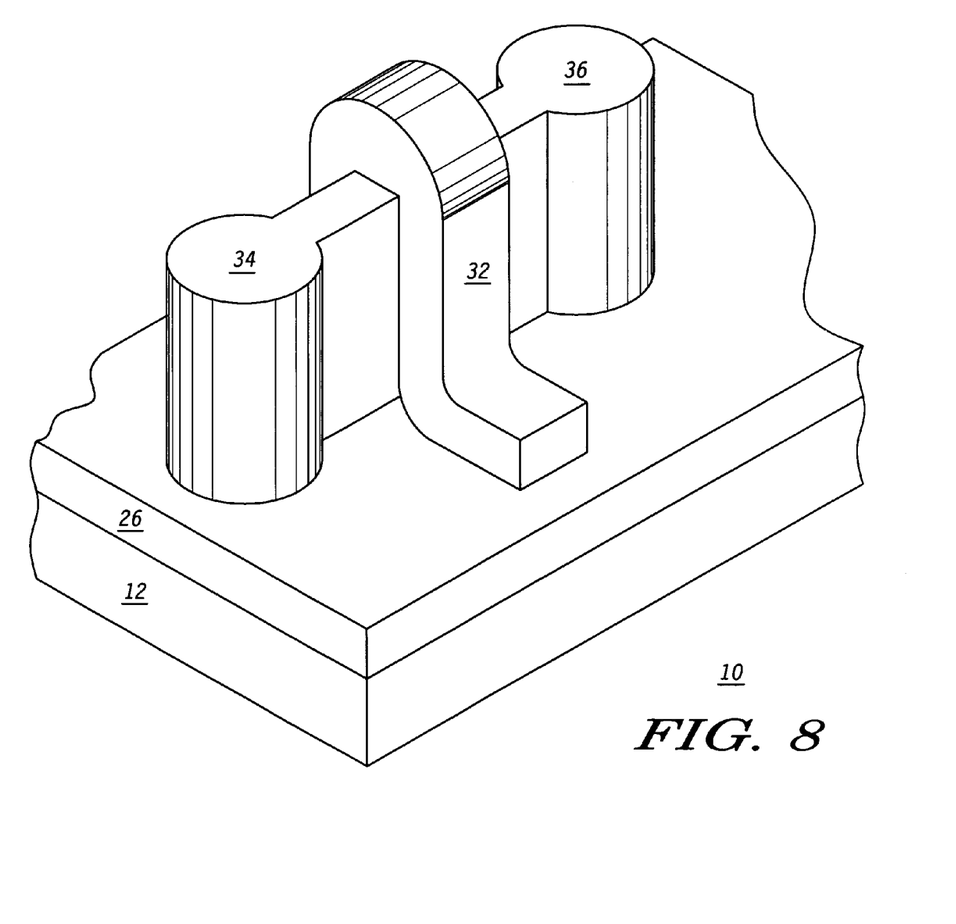
FIG. 8 illustrates in perspective form a completed semiconductor device made using the method of FIGS. 1-7.

Illustrated in FIG. 8 is a perspective of the semiconductor device 10 which has been discussed in the previous figures. For purposes of comparison, similar elements are numbered identically. In addition to gate electrode 32, a source region 34 and a drain region 36 are provided and separated by the gate electrode 32. Source region 34, drain region 36 and gate electrode 32 all overlie and are supported by the isolation region 26. Isolation region 26 is formed by oxidizing exposed silicon surfaces of the horizontal active region 20 that extended laterally from the vertical active region 18 that functions herein as a channel. The portions of vertical active region 18 covered by the gate electrode 32 become a channel, and portions of vertical active region 18 that are doped become the source region 34 and drain region 36.

Because the exposed surfaces in FIG. 8 of isolation region 26 were formed from the horizontal active region 20, the previously described wet clean such as the wet HF clean will not aggressively etch away the buried oxide layer 12. This avoids the undercutting of oxide below any of the vertical structures that have been formed in FIG. 8. Thus the method described herein functions to avoid problems common in conventional FinFET structures in which undercutting around the channel and other vertical regions compromised the structure and operation of the device. By having an insulating layer formed from part of the original or initial silicon overlying the buried oxide, the undercutting of the buried oxide around vertical structures from processing such as cleans and etches is avoided. The isolation region 26 functions in two ways. Structurally, because of volume expansion of the silicon, the isolation region 26 extends to a height that is above a lowest point of the vertical active region 18. This additional differential in height can be removed without causing any undercutting of the isolation region 26 at the interface with the vertical active region 18. Chemically, the etch rate of the isolation region 26 is much slower than the etch rate of the buried oxide layer 12 which is exposed in conventional processes. As a result of using a slower etching material adjacent to the vertical structures, the amount of undercutting is substantially minimized.

Figure 9:
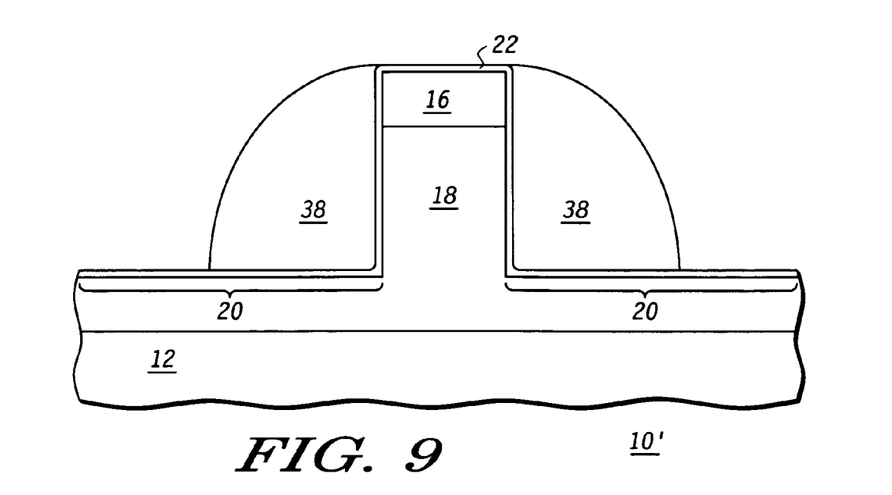
FIGS. 9-12 illustrate in cross-sectional form a method for forming a semiconductor device in accordance with another form of the present invention.

Illustrated in FIG. 9 is another embodiment of semiconductor device 10 which is identified as a semiconductor device 10'. Additionally a large spacer 38 is used to mask portions of horizontal active region 20. As before, the etch stop liner 22 is an etch stop layer that aids in making the large spacer 38 by assisting in endpointing the spacer etch.

Figure 10:
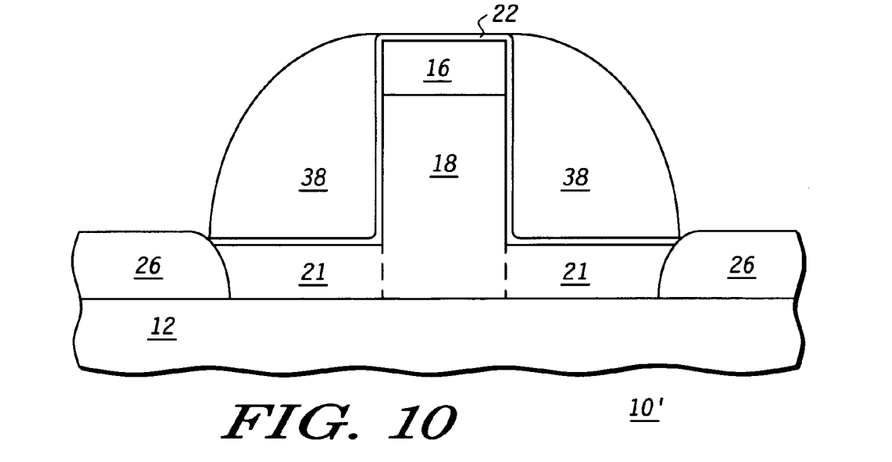

Illustrated in FIG. 10 illustrates that a larger portion of the horizontal active region 20 is not oxidized as compared with semiconductor device 10. The increased area for the horizontal active region 20 provides additional transistor active area. The increased active area permits additional current conduction for semiconductor device 10'.

Figure 11:
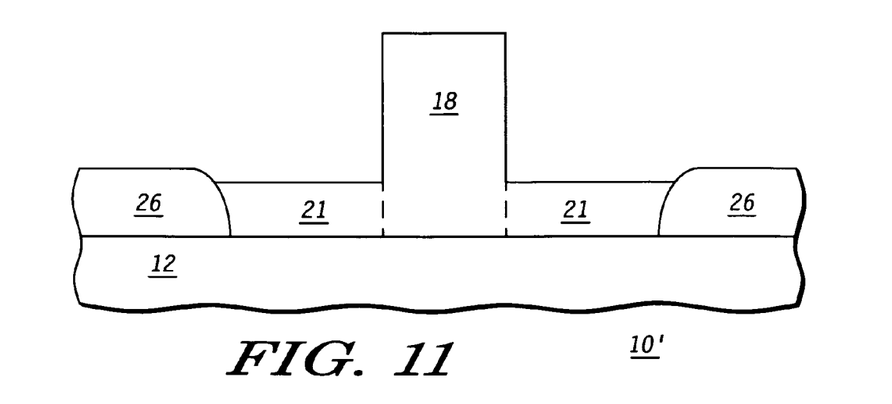
Figure 12:
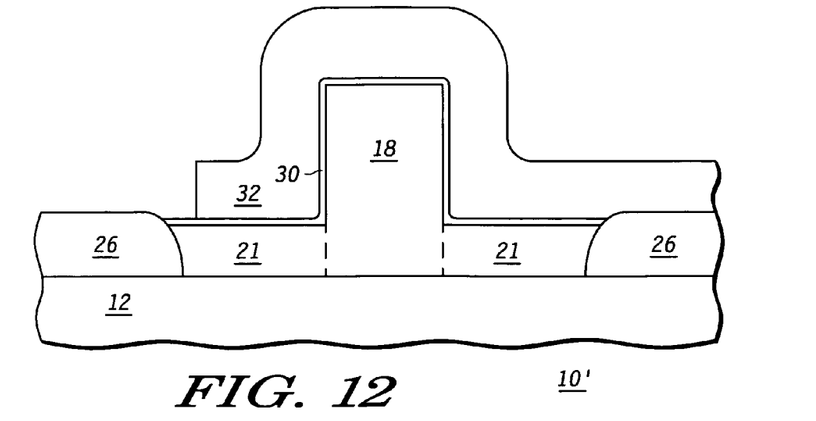
Figure 13:
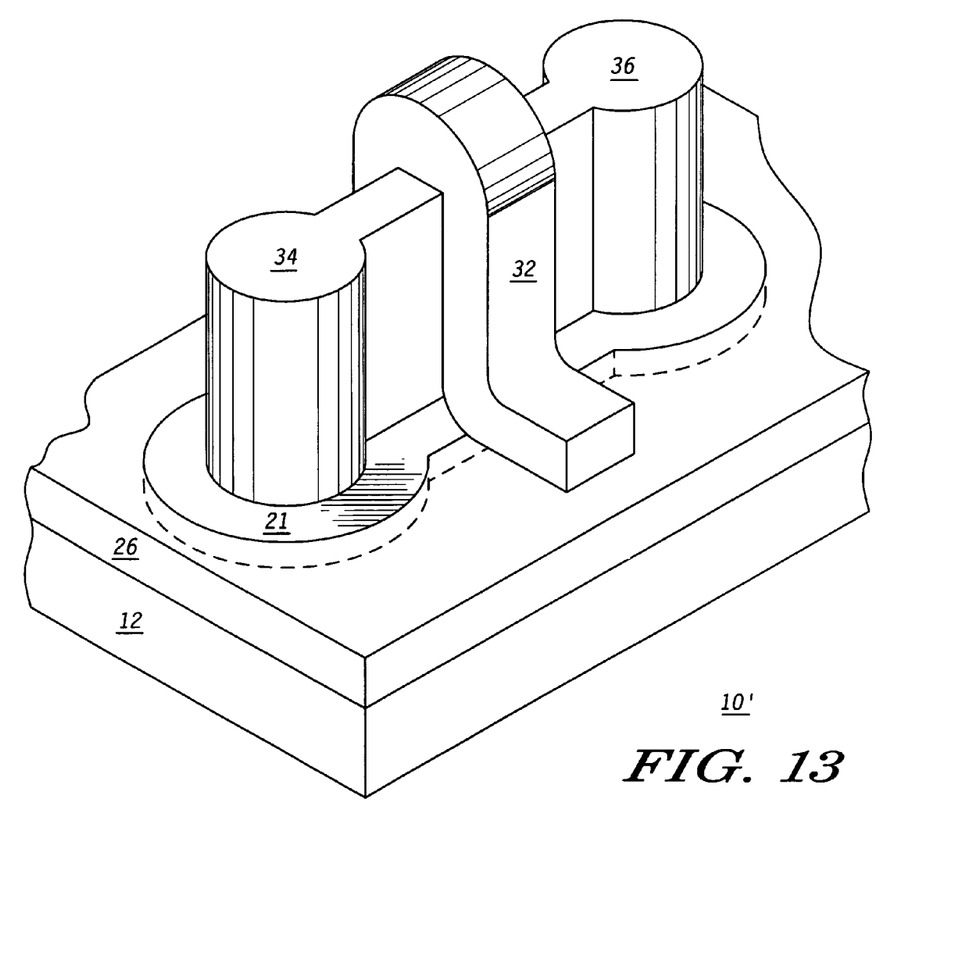
FIG. 13 illustrates in perspective form a completed semiconductor device made using the method of FIGS. 9-12.

Illustrated in FIGS. 11-13 is further processing of semiconductor device 10' that is analogous to the processing of semiconductor device 10 in FIGS. 5-8. As seen in the perspective view of FIG. 13, in addition to the thermally grown isolation region 26 overlying the buried oxide layer 12, there is also a horizontal active silicon region 21 that is within the isolation region 26 and above the buried oxide layer 12. We have provided a semiconductor device 10' that has increased active area and conducts in both the vertical (along the vertical sidewalls) and the horizontal (along the lateral layout of the active silicon region 21) regions. Therefore, in addition to avoiding undercutting of the vertical structures, additional horizontal active region is provided which results in increased current drive.

Figure 14:
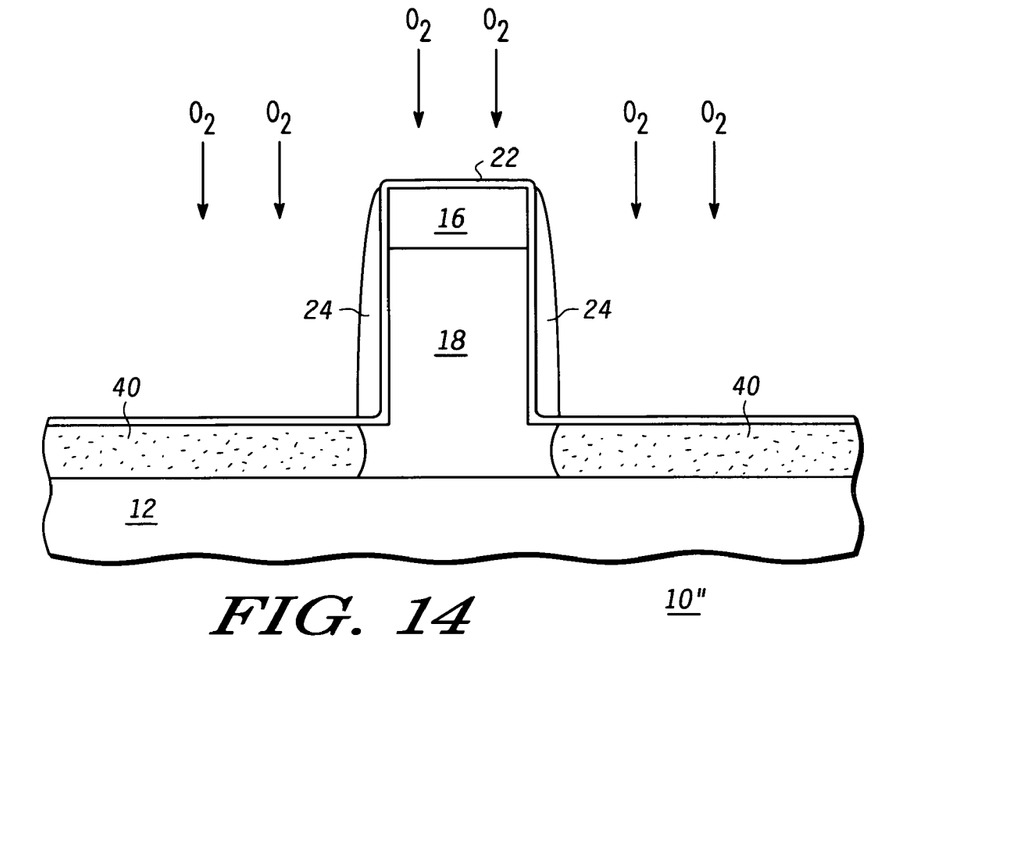
FIGS. 14 and 15 illustrate in cross-sectional form a method of forming a semiconductor device in accordance with another form of the present invention.
Figure 15:
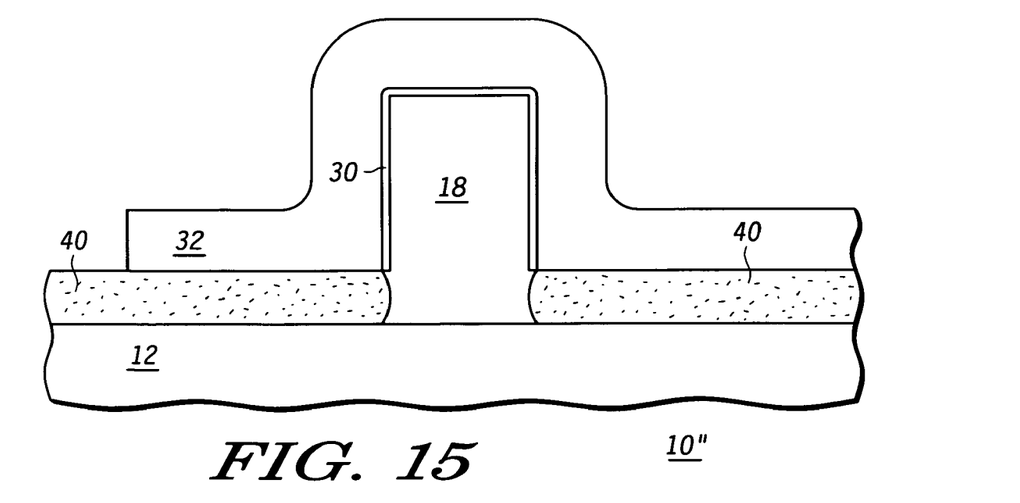
Figure 16:
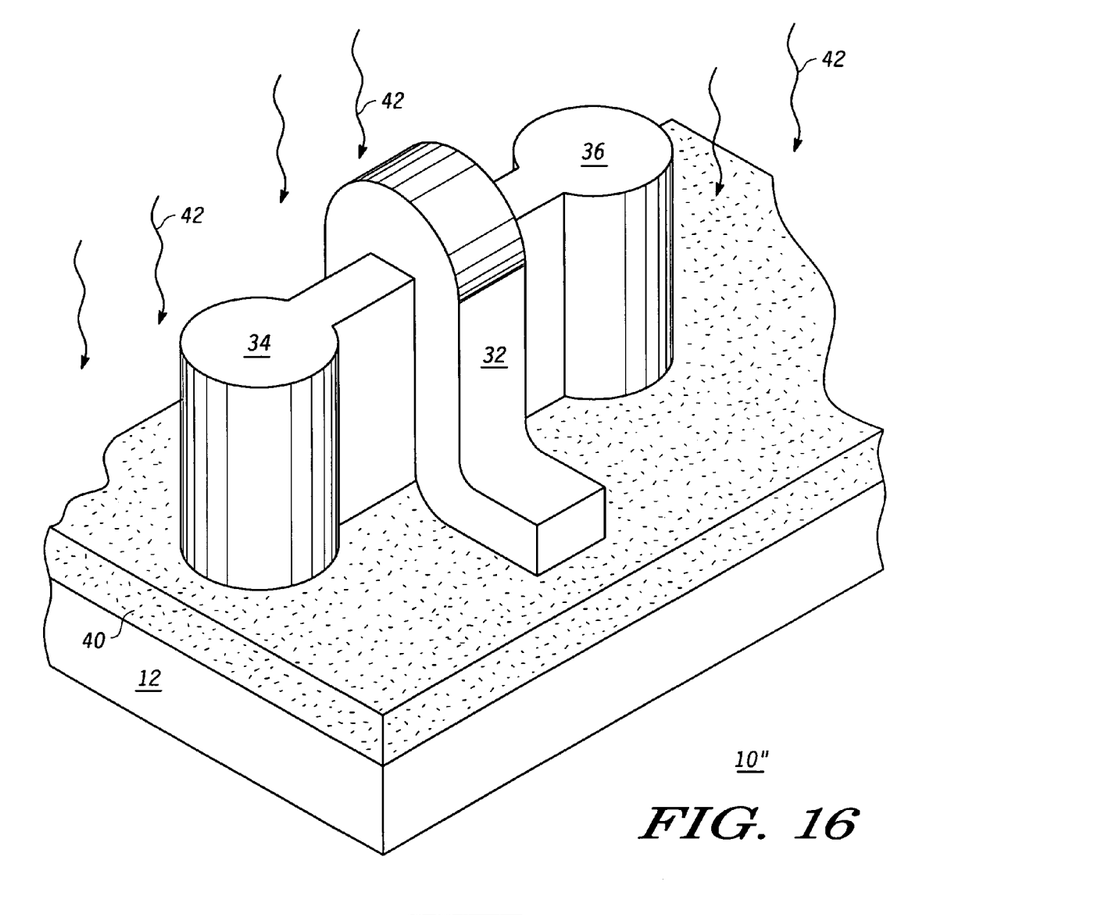
FIG. 16 illustrates in perspective form a completed semiconductor device made using the method of FIGS. 14 and 15.
Figure 17:
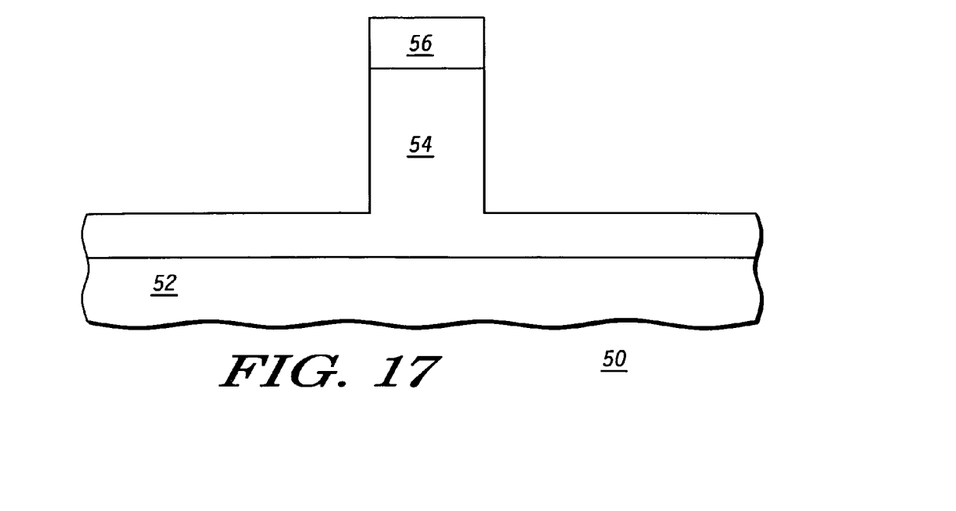
FIGS. 17-19 illustrate in cross-sectional form another form of making a semiconductor device in accordance with the present invention.

Illustrated in FIG. 14 is another method of forming a semiconductor device 10" which has an oxygen implant region that is similar to isolation region 26 of semiconductor devices 10 and 10". However, as shown in FIG. 14, at the point of processing discussed in FIGS. 3 or 9, an oxygen implant is performed to incorporate oxygen into the horizontal active region 20 of FIGS. 3 or 9. This implant may be implemented by various processes, such as by conventional ion implantation or plasma implantation. This implantation results in the formation of a high dose of oxygen incorporated into the horizontal regions of the silicon and the formation of an oxygen implant region 40. In this form, there is no oxidation performed as described in the previously described form. Processing of the gate dielectric 30 and the gate electrode 32 in FIG. 15 is performed as previously described in connection with FIG. 7. A perspective view of semiconductor device 10" is illustrated in FIG. 16. An anneal 42 is performed to oxidize the oxygen implant region 40. Typical anneal temperatures to perform this function may vary. One range of temperatures includes the range from 800 degrees Centigrade to 1200 degrees Centigrade, but it should be understood that other temperatures may be used. Because oxygen is implanted into the regions that need to be electrically insulating, the annealing transforms the oxygen implant region 40 into an insulating oxide material. An advantage of this process is that the oxygen implant region 40 remains chemically silicon until the anneal step. Therefore chemical etchants that etch oxide do not etch the silicon, thereby eliminating any undercutting of the vertical structures which the oxygen implant region 40 surrounds.

Illustrated in FIGS. 17-20 is another form of the methods described herein for the purpose of reducing the width of the fin and the depth of the horizontal active region without suffering from undercutting of the vertical structures. In particular, in FIG. 17 a semiconductor device 50 has a buried oxide layer 52 with an overlying patterned silicon region 54. A hard mask 56 is used to permit patterning of the silicon region 54 to form a fin structure.

Figure 18:
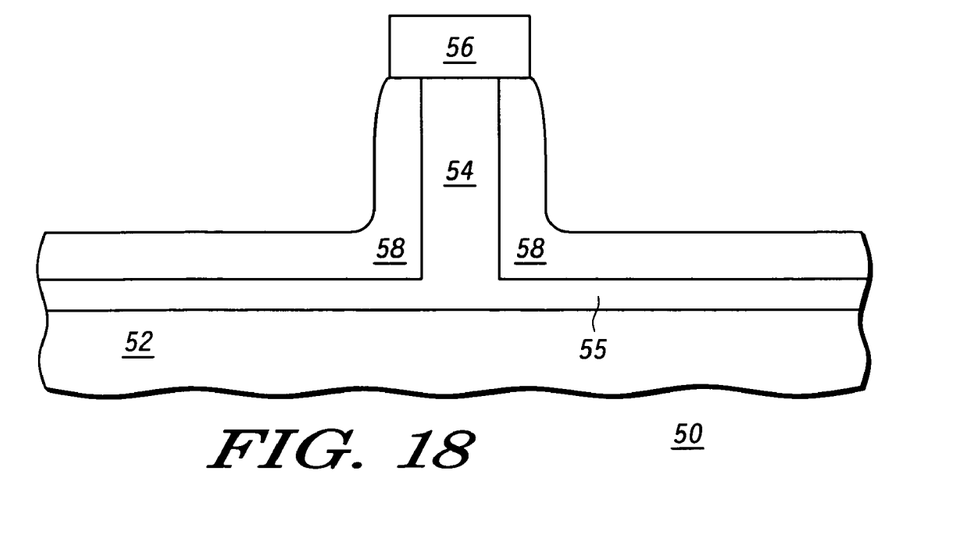

Illustrated in FIG. 18 is silicon within silicon region 54 that is consumed by an oxidation to result in an oxide region 58. Note that the width of silicon region 54 is reduced from two opposing sides vertically and from one surface horizontally at the horizontal silicon region 55. As a result, both the width and depth of silicon region 54 are reduced, but the width is reduced at a faster rate.

Figure 19:
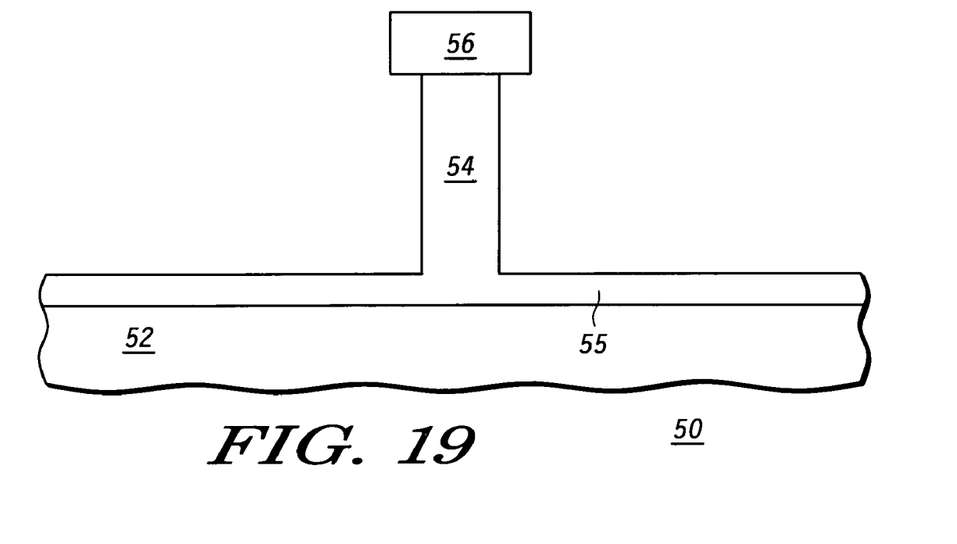

Illustrated in FIG. 19 is further processing of semiconductor device 50 wherein the oxide region 58 is removed by a conventional wet etch. It should be noted that the presence of a horizontal silicon region 55 prevents any undercutting into the buried oxide layer 52. The processing of FIGS. 17-20 may be implemented in any FinFET structure or in any of the FinFET methods described herein.

In the foregoing specification, the invention has been described with reference to specific embodiments. However, one of ordinary skill in the art appreciates that various modifications and changes can be made without departing from the scope of the present invention as set forth in the claims below. For example, the substrate used could use buried oxide that is a combination of oxides and nitrides. The silicon region may be exchanged with other materials such as silicon germanium, gallium nitride and other combinations of these materials. Gate dielectric materials may be silicon nitride, silicon oxynitride, hafnium oxide and other high dielectric constant materials. The gate electrode may be a combination of polysilicon, polysilicon germanium, germanium, titanium nitride, tantalum carbide, silicided versions of these materials and combinations of these materials. The source, drain and channel of the structures described herein may be doped appropriately to form either N-channel or P-channel devices. The fin structures described herein may also be used to form semiconductor functions such as a diode or a bipolar junction transistor.

In one form there is herein provided a method of forming a semiconductor device by patterning a semiconductor layer to form a vertical active region and a horizontal active region. The horizontal active region is adjacent the vertical active region and the semiconductor layer overlies an insulating layer. A spacer is formed adjacent the vertical active region and over a portion of the horizontal active region. At least a portion of the horizontal active region is oxidized to form an isolation region. The spacer is removed and a gate dielectric is formed over the vertical active region after removing the spacer. A gate electrode is formed over the gate dielectric. In another form the portions of the horizontal active region that are uncovered by the spacer are oxidized. In another form the oxidizing of at least a portion of the horizontal active region is performed before removing the spacer. In another form the at least a portion of the horizontal active region is oxidized by implanting oxygen into a portion of the horizontal active region that is uncovered by the spacer to form an oxygen implant region, and the oxygen implant region is annealed after forming the gate electrode. In another form a source region and a drain region are formed in the vertical active region, wherein the source region and the drain region are formed by implanting a dopant into portions of the vertical active region and annealing the dopant. In one form annealing the dopant is performed while oxidizing the oxygen implant region. In yet another form a source region and a drain region are formed in the vertical active region, wherein the source region and the drain region are formed by implanting a dopant into portions of the vertical active region and annealing the dopant. The dopant anneal conditions can be chosen such that the dopant is annealed in one step and the oxygen implanted region is oxidized in another step. In one form the isolation region extends underneath the vertical active region. In another form the semiconductor layer is patterned by etching a semiconductor layer to form an initial vertical region and an initial horizontal region. In one form the vertical region has two sidewalls that are parallel to each other and the horizontal region has an exposed top surface. In another form the vertical region and the horizontal region are oxidized to form an oxide along at least the two sidewalls of the vertical region and the exposed top surface of the horizontal region. The oxide is removed from the two sidewalls of the vertical region and the exposed top surface of the horizontal region to form a vertical active region and a horizontal active region, wherein the vertical active region is narrower than the initial vertical region and the horizontal active region has a height less than that of the initial horizontal region. In another form the entire horizontal active region is oxidized. In yet another form the isolation region extends underneath the vertical active region. In one form the insulating layer is a buried oxide layer.

There is also herein provided a method of forming a semiconductor device by providing a semiconductor substrate that is a buried oxide layer. A vertical active region and a horizontal active region are formed over the buried oxide layer. The vertical active region is a source region, a channel region, and a drain region and has a sidewall. The channel region has a first dimension wherein the first dimension is perpendicular to the sidewall. The source region has a second dimension wherein the second dimension is perpendicular to the sidewall and is greater than the first dimension. The drain region has a third dimension wherein the third dimension is perpendicular to the sidewall and is greater than the first dimension. At least a portion of the horizontal active region is oxidized to form an isolation region. A gate dielectric is formed over the vertical active region and a gate electrode is formed over the gate dielectric. In one form a spacer is formed adjacent the vertical active region and over a portion of the horizontal active region. In another form the portions of the horizontal active region that are uncovered by the spacer are oxidized. In another form a spacer is formed adjacent the vertical active region and over a portion of the horizontal active region. The spacer is removed, wherein removing the spacer is performed after oxidizing at least a portion of the horizontal active region. In yet another form a spacer is formed adjacent the vertical active region and over a portion of the horizontal active region. The spacer is removed and at least a portion of the horizontal active region is oxidized by implanting oxygen into a portion of the horizontal active region that is uncovered by the spacer to form an oxygen implant region. The oxygen implant region is oxidized after forming the gate electrode.

In another form a source region and a drain region are formed in the vertical active region by implanting a dopant into portions of the vertical active region. The dopant is annealed wherein annealing the dopant is performed while oxidizing the oxygen implant region. In another form a source region and a drain region are formed in the vertical active by implanting a dopant into portions of the vertical active region. In one form multiple anneals are carried out before and after the dopant implants to optimize the dopant activation and the oxidation of the oxygen implanted region. Annealing the dopant is performed in a separate step from oxidizing the oxygen implant region. In yet another form the vertical active region and the horizontal active region are formed by etching a semiconductor layer to form an initial vertical region and an initial horizontal region. The semiconductor layer is over the buried oxide layer, the vertical region has two sidewalls that are parallel to each other, and the horizontal region has an exposed top surface. The vertical region and the horizontal region are oxidized to form an oxide along at least the two sidewalls of the vertical region and the exposed top surface of the horizontal region. The oxide is removed from the two sidewalls of the vertical region and the exposed top surface of the horizontal region to form a vertical active region and a horizontal active region. The vertical active region is narrower than the initial vertical region and the initial horizontal active region has a height less than that of the horizontal region. In another form at least a portion of the horizontal active region is oxidized to form an isolation region by oxidizing portions of the horizontal active region and the vertical active region that are under the source region, the drain region, and the channel region.

In yet another form there is herein provided a semiconductor device having a semiconductor substrate with a buried oxide layer. A vertical active region is over the buried oxide layer. The vertical active region includes a source region, a channel region, and a drain region and has a sidewall. The channel region has a first dimension, wherein the first dimension is perpendicular to the sidewall. The source region has a second dimension, wherein the second dimension is perpendicular to the sidewall and is greater than the first dimension. The drain region has a third dimension, wherein the third dimension is perpendicular to the sidewall and is greater than the first dimension. A thermally grown oxide is over the buried oxide layer, wherein the insulating region is under all of the source region, the channel region, and the drain region. A gate dielectric is over the vertical active region. A gate electrode is over the gate dielectric.

Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A method of forming a semiconductor device, the method comprising:
    patterning a semiconductor layer of silicon to form a vertical active region and a horizontal active region, wherein the horizontal active region is adjacent the vertical active region and the semiconductor layer overlies an insulating layer;
    forming a spacer adjacent the vertical active region and over a portion of the horizontal active region;
    forming a mask layer over the vertical active region;
    implanting oxygen into the horizontal active region, the horizontal active region chemically remaining silicon
    removing the spacer and the mask layer with a chemical etchant that removes the spacer and mask layer without removing the horizontal active region or the vertical active region;
    forming a gate dielectric over the vertical active region after removing the spacer;
    forming a gate electrode over the gate dielectric and a portion of the horizontal active region; and
    annealing the oxygen after removing the spacer to make the horizontal active region chemically change from silicon to an insulating oxide material to electrically insulate the gate electrode,
    wherein the insulating oxide material electrically insulates the gate electrode from the insulating layer, which is a buried oxide layer, and the vertical active region is in direct contact with the buried oxide layer.

2. A method of forming a semiconductor device, the method comprising:
    providing a semiconductor substrate comprising a buried oxide layer;
    forming a vertical active region and a horizontal active region over the buried oxide layer wherein:
        the vertical active region comprises a source region, a channel region, and a drain region and has a sidewall;
        the channel region has a first dimension, wherein the first dimension is perpendicular to the sidewall;
        the source region has a second dimension, wherein the second dimension is perpendicular to the sidewall and is greater than the first dimension; and
        the drain region has a third dimension, wherein the third dimension is perpendicular to the sidewall and is greater than the first dimension;
    prior to forming a source, a channel and a drain respectively within the source region, the channel region and the drain region, oxidizing all of the sidewall of the vertical active region by consuming a portion of the channel region and oxidizing less than all of the horizontal active region to form an oxide region along all of the sidewall, the channel region having a resulting fourth dimension that is less than the first dimension;

removing the oxide region with a chemical etch wherein a remainder of the horizontal active region protects the buried oxide layer from the chemical etch;

forming a gate dielectric over the vertical active region; and forming a gate electrode over the gate dielectric.

3. A method of forming a transistor, the method comprising:

providing an insulating layer;

forming a semiconductor layer of silicon overlying the insulating layer and patterning the semiconductor layer to form a vertical fin and an adjacent horizontal region;

forming an etch stop liner on the vertical fin and the adjacent horizontal region;

forming a mask layer over the vertical fin;

forming a sidewall spacer adjacent sidewalls of the vertical fin;

implanting oxygen into the adjacent horizontal region;

removing the sidewall spacer with a chemical etchant that does not chemically react with the adjacent horizontal region, thereby not removing the vertical fin and the adjacent horizontal region;

after removing the sidewall spacer, annealing the adjacent horizontal region to activate the oxygen that was implanted and forming an oxide;

forming a drain and a source at opposing ends of the vertical fin; and forming a gate electrode overlying the vertical fin and between the source and the drain.

* * * * *